United States Patent
McIntosh et al.

(10) Patent No.: US 6,556,417 B2
(45) Date of Patent: Apr. 29, 2003

(54) METHOD TO CONSTRUCT VARIABLE-AREA CAPACITIVE TRANSDUCERS

(76) Inventors: Robert B. McIntosh, 309 Vassar Rd., Alexandria, VA (US) 22314; Philip E. Mauger, 3876 Baldwin Dr., Santa Clara, CA (US) 95051; Steven R. Patterson, 1179 Ashford Green Ave., Concord, NC (US) 28027

( * ) Notice: Subject to any disclaimer, the term of this patent is extended or adjusted under 35 U.S.C. 154(b) by 180 days.

(21) Appl. No.: 09/834,691

(22) Filed: Apr. 13, 2001

(65) Prior Publication Data

US 2001/0020320 A1 Sep. 13, 2001

Related U.S. Application Data

(60) Continuation-in-part of application No. 09/482,119, filed on Jan. 13, 2000, now Pat. No. 6,456,477, which is a division of application No. 09/037,733, filed on Mar. 10, 1998, now Pat. No. 6,151,967.

(51) Int. Cl.$^7$ ................................................. H01G 5/01
(52) U.S. Cl. ....................................................... 361/278
(58) Field of Search ............................ 361/15, 16, 272, 361/277, 278, 280, 283.3, 283.4; 73/514.32, 718; 29/25.41

(56) References Cited

U.S. PATENT DOCUMENTS

| | | | | |
|---|---|---|---|---|
| 3,646,433 A | * | 2/1972 | Eilersen | ........................ 324/60 |
| 3,863,147 A | * | 1/1975 | Erath | ........................ 324/60 |
| 4,563,634 A | * | 1/1986 | Lehle | ........................ 324/61 R |
| 4,634,965 A | * | 1/1987 | Foote | ........................ 324/60 |
| 4,785,664 A | * | 11/1988 | Reebs | ........................ 73/290 |
| 4,831,492 A | * | 5/1989 | Kuisma | ........................ 361/283 |
| 5,006,952 A | * | 4/1991 | Thomas | ........................ 361/283 |
| 5,019,783 A | * | 5/1991 | Cadwell | ........................ 324/662 |
| 5,294,889 A | * | 3/1994 | Heep et al. | ........................ 324/678 |
| 5,399,980 A | * | 3/1995 | Rashford | ........................ 324/678 |
| 5,406,137 A | * | 4/1995 | Scheler et al. | ........................ 327/509 |
| 5,428,352 A | * | 6/1995 | Bennett | ........................ 340/70.37 |

* cited by examiner

Primary Examiner—Matthew Nguyen

(57) ABSTRACT

A method to construct a capacitive transducers comprising the steps of forming over and in a planar surface of a substrate at least one rigid electrode of a variable-area capacitor electrically connected to a location on said substrate reserved for electrode attachment; providing a cooperating flexible electrode with a dielectric layer; and bonding said flexible electrode to said substrate in a surface region surrounding said rigid electrode.

20 Claims, 5 Drawing Sheets

METHOD TO CONSTRUCT VARIABLE-AREA CAPACITIVE TRANSDUCERS

CROSS-REFERENCE TO RELATED APPLICATIONS

This application is a continuation-in-part of application Ser. No. 09/482,119, Jan. 13, 2000 now U.S. Pat. No. 6,456,477, which is a divisional of application Ser. No. 09/037,733 of Mar. 10, 1998, now U.S. Pat. No. 6,151,967, each incorporated by reference in its entirety. All of the applications are assigned to the same assignee as the present application.

GOVERNMENT RIGHTS

This invention was made with Government support under contract N00024-97-C-4157 from the Naval Sea Systems Command. The Government has certain rights to this invention

FIELD OF THE INVENTION

The present invention relates to capacitive transducers that directly and differentially sense force, pressure, strain, vibration, acceleration, gravity, sound, mechanical displacement, electric charge, radiation, and fluid flow over a wide dynamic range. More specifically, this invention relates to a method to fabricate capacitive transducers with one or more of variable-area capacitor elements.

BACKGROUND OF THE INVENTION

Many potential high-volume applications exist for variable-area capacitors of U.S. Pat. No. 6,151,967 that have a high quiescent capacitance and a large change of capacitive compared to existent variable-gap capacitors. Accordingly, a method was developed to fabricate variable-area capacitors with flexible sensing diaphragms from materials having a wide range of modulus of elasticity.

Variable-area capacitive transducers have been constructed by bonding silicon diaphragms and membranes to glass substrates with metal film counter-electrodes. Capacitive transducers also have been constructed by bonding highly flexible metallized polymer films to polymer substrates. Both crystalline and polymer membranes with deposited metal films have been bonded to substrates with multiple electrodes to form capacitive transducers with multiple variable-area capacitor elements. All the forgoing embodiments of a variable-area capacitor transducer have been constructed by the method of the present invention.

SUMMARY OF THE INVENTION

One object of the present invention is to provide a common method to easily manufacture variable-area capacitive transducers of simple construction to transduce physical effects both directly and differentially.

A further object of the present invention is to provide a method to fabricate variable-area capacitors with sensing diaphragms of highly elastic materials such as single crystal silicon.

Another object of the present invention is to provide a method to fabricate variable-area capacitors from low-cost, thermoplastic materials such a polycarbonate.

Still another object of the present invention is to fabricate capacitive transducers with a plurality of variable-area capacitor elements.

DETAILED DESCRIPTION OF THE INVENTION

Figure 1:
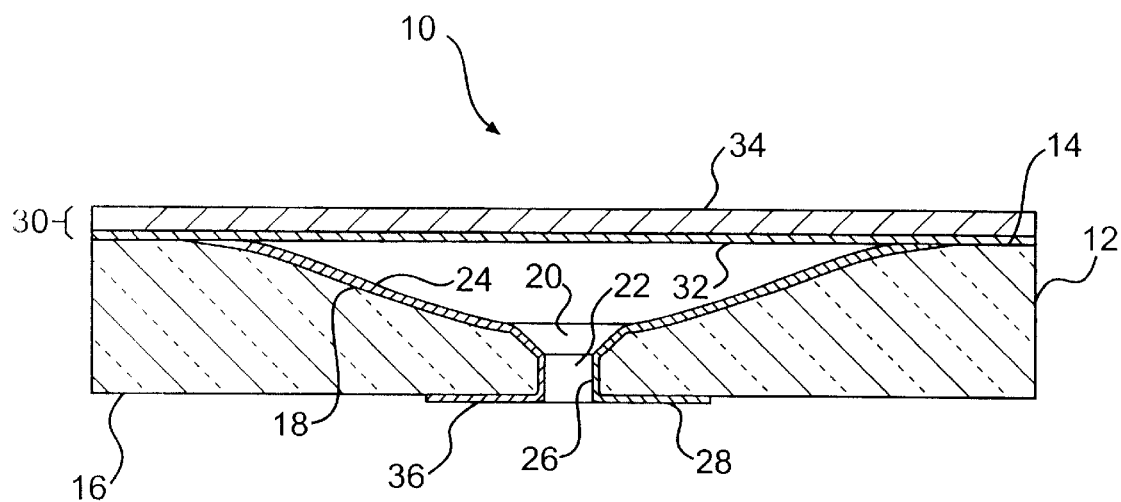
FIG. 1 is a sectional drawing of a variable-area capacitor.

In the following description, for purposes of explanation, specific numbers, dimensions, and materials are set forth to provide a through understanding of this invention. It will be apparent to one skilled in the art that the present invention may be practiced in other embodiments that depart from these specific details. Well known techniques for processing semiconductor materials, fabricating micromachined devices, and forming micro-optics are referred to without elaboration so not to obscure the present invention with unnecessary detail.

All the drawings are schematic in nature and thus features in the drawings are not shown to relative scale. For drawing clarity, where multiple elements of identical structure are illustrated only the features of a representative element are identified by a reference numeral.

FIG. 1 shows one embodiment of a variable-area capacitive transducer, generally identified by reference numeral 10 constructed using the method of the present invention. Transducer 10 includes a substrate 12 of dielectric material with a first surface 14 opposing a second surface 16. A contoured region 18 is formed over and in a portion of first surface 14 of substrate 12. Contoured region 18 has maximum depth at a midpoint 20 and a symmetrical section around midpoint 20. A cavity 22 is formed between contoured region 18 and surface 16 of substrate 12. A rigid electrode 24 with an electrical connection 26 is formed by depositing a first metal layer on surface 14 in a region substantially limited to the areal extent of contoured region 18 and on a wall of cavity 22. A second metal layer 28 is deposited on at least a portion of surface 16 and on said wall of cavity 22, metal layer 28 overlapping a portion of electrical connection 26 to form electrical continuity between rigid electrode 24 and metal layer 28. A surface portion of metal 28 provides a region 36 for attaching an external electrode. A diaphragm 30 is provided with a dielectric layer 32 on which is deposited an electrically conductive layer 34. Conducting layer 34 comprises a cooperating flexible electrode of transducer 10. A portion of diaphragm 30 is bonded to surface 14 in a region surrounding contoured region 18 and rigid electrode 24.

Dielectric layer 32 maintains a fixed capacitor spacing between a portion of mutually opposed surfaces of rigid and flexible capacitor electrode 24 and 34 respectively. The shape of contoured region 18 controls the rate of change in the capacitance area with fixed spacing as diaphragm 30 deflects in response to a physical effect. When diaphragm 30 is a highly flexible membrane of material such as aluminized polycarbonate and is subjected to uniform pressure, its generatrix is substantially determined by tensile stresses. For this case, the shape of contoured region 18 can be selected to provide a substantially linear increase in the capacitive of transducer 10 with pressure over a wide dynamic range. When diaphragm 30 is constructed from a thicker, more rigid material such as silicon, its generatrix is substantially determined by bending stresses and a another shape must be selected for contoured region 18 to provide a linear or another type of capacitive response with pressure. Cavity 22 provides a passage for pressure equalization or for evacuation of the internal volume of transducer 10.

Figure 2:
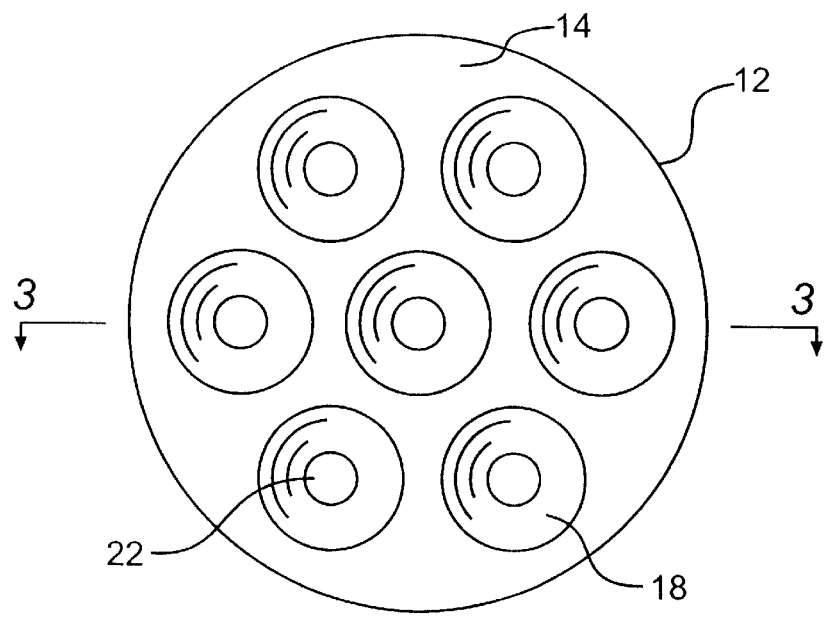
FIG. 2 is a top view of a substrate with a contoured region comprising dish-shaped depressions.
Figure 3A:
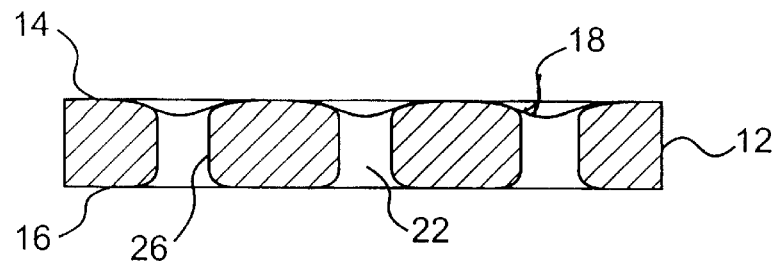
FIG. 3A is a sectional view of the substrate of FIG. 2.

FIG. 2 is a top view and FIG. 3A is a sectional view of a substrate 12 with contoured region 18 comprising an array of dish-shaped depressions for a capacitive transducer having multiple variable-area capacitor elements. For diaphragms of equal stiffness, a transducer with multiple capacitor elements has a dynamic response that extends to higher frequencies than the response of a transducer of comparable size with a single capacitor element. A transducer with multiple capacitor elements can be used for applications such as acoustic wavefront analysis and imaging.

Figure 3B:
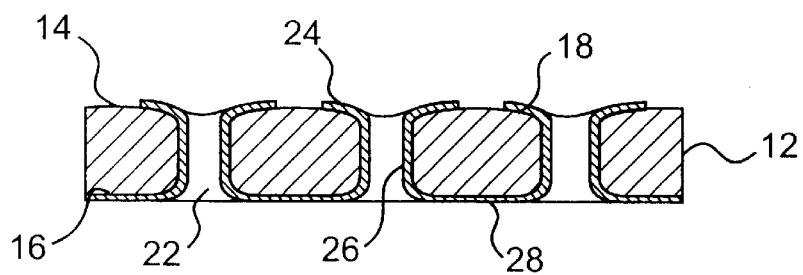
FIG. 3B is a sectional view of the substrate of FIG. 2 after metal deposition.

FIG. 3B is a sectional view of substrate 12 of FIG. 2 after deposition of rigid electrodes 24, electrical connections 26, and metal layer 28. As an example, rigid electrode 24 can be a vacuum deposited coating of aluminum for a thermoplastic substrate. Other metals are required for substrates of borosilicate or aluminosilicate glass that are subjected to higher bonding temperatures. Rigid electrode 24 and metal layer 28 deposited on glass substrates can comprise a coating of gold deposited over a coating of platinum deposited over a coating of titanium using a multi-target, vacuum sputtering system. The titanium serves as an adhesion layer and the platinum as an alloying barrier. The gold coating provides a surface on which electrical terminals can be reliably bonded.

Figure 3C:
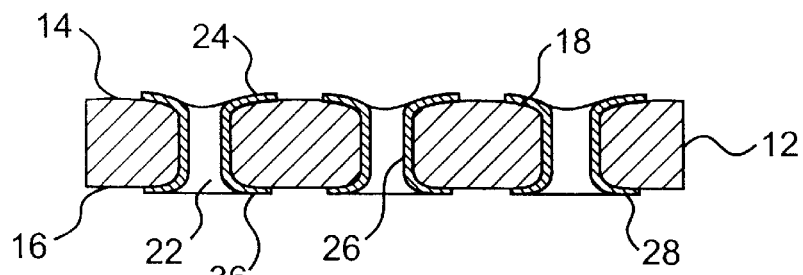
FIG. 3C is a sectional view of the substrate of FIG. 3B after patterning and etching a metal layer.

FIG. 3C is a sectional view of substrate 18 of FIG. 3B after the steps of lithographic patterning and etching of metal layer 28 to provide a region 36 around cavity 22 for the attachment of an external electrode to individual capacitance elements. When these steps are not performed, the multiple capacitor elements remain electrically connected in parallel as is desirable for many sensing applications.

Figure 3D:
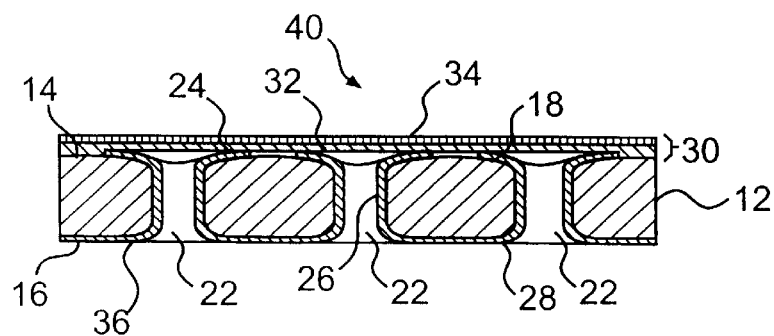
FIG. 3D is a sectional view of a capacitive transducer after bonding a flexible diaphragm.

FIG. 3D is a sectional view of a variable-area capacitor with multiple capacitor elements generally shown by reference numeral 40. Transducer 40 is formed by bonding diaphragm 30 to substrate 12 with rigid electrode 24 and metal layer 28 of FIG. 3B.

Diaphragm 30 of transducer 10 of FIG. 1 and transducer 40 of FIG. 3D can comprise a metallized thermoplastic film of material such as polycarbonate, polyester, polyamide, Polysulfone, PEEK, and Pyralin. Alternately diaphragm 30 can comprise metal layer 32 vacuum sputter deposited on a surface of an intermediate support layer of doped silicon with dielectric layer 32 thermally grown or chemically vapor deposited on an opposing surface of the silicon support layer. The material of dielectric layer 32 can be selected from the group consisting of silicon dioxide, silicon nitride, silicon oxynitride, silicon carbide, aluminum oxide, glass, PMMA, photoresist, and a thermoplastic. Thick diaphragms 30 with intermediate layers of silicon are self supporting and can be bonded directly to substrate 12. Diaphragms that comprise a thin membrane can be provided with a support rim and a surface of said rim contiguous with said diaphragm bonded to substrate 12. Metallized polycarbonate membranes have been directly thermally bonded to polycarbonate substrates after first attaching the membranes to temporary handling rings. Large, flat, uniformly tensioned membranes can be adhered to handling rings by the methods used to manufacture pellicles. Alternately, polymer and crystalline membranes with controlled tension can be provided and handled by the method of Windischmann et al, U.S. Pat. No. 4,579,616. Silicon diaphragms with predetermined stress can be provided by the method of Mauger et al, U.S. Pat. No. 4,919,749.

Metallized thermoplastic membranes on handling rings can be thermally bonded to thermoplastic substrates. A membrane is placed across a substrate and a heated metal stamp with a ribbed contour is used to bond the membrane by pressed it against the metallized side of the membrane until the temperature of the thermoplastic film is raised just above its glass transition temperature.

Figure 4:
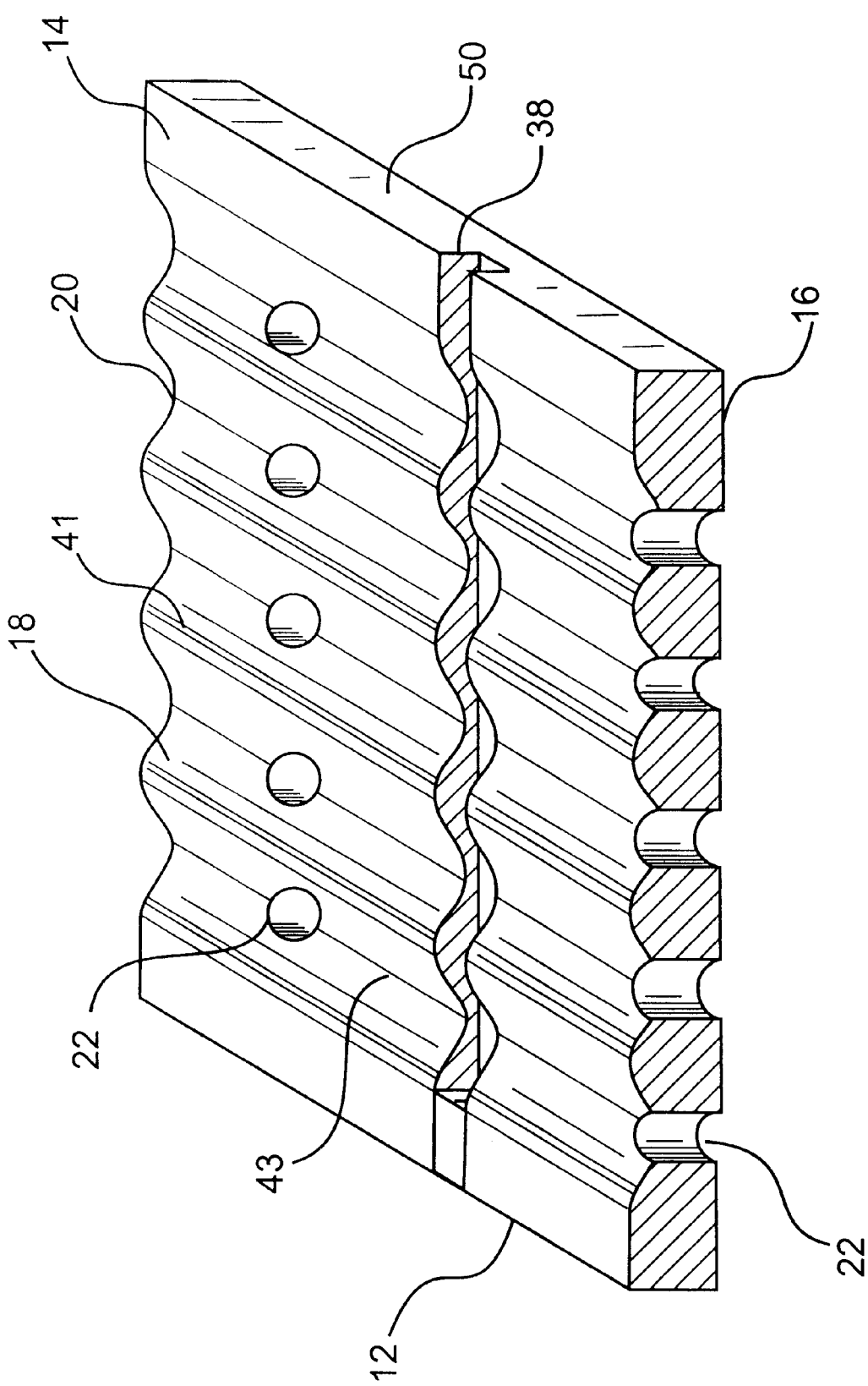
FIG. 4 illustrates a portion of a substrate with a contoured region comprising ridges and valleys.

FIG. 4 illustrates a portion of a substrate 12 with contoured region 18 that includes a series of connected ridges 41 and valleys 43. Contoured region 18 is formed over and in a portion of surface 14 of said substrate 12. Cavities 22 can be formed between the valleys 43 of surface contour 18 to surface 16. Alternately, or in addition to cavities 22, a passage 38 can be formed to connect valleys 43 to an edgewall 50 of substrate 12 for pressure equalization, evacuation, and to provide an electrical connection formed after the deposition of rigid electrodes 24 over contoured region 18.

One advantage of contoured region 18 of FIG. 4 is that it supports rectangular areas of a sensing diaphragm. Under a given load, a rectangular diaphragm element with a width, a, deflects more than a circular element with a diameter, a, or a square element with sides of width, a.

The material of substrate 12 of FIGS. 1, 2, and 4 can be selected from the group consisting of glass, fused silica, quartz, sapphire, silicon, PMMA, an epoxy, a photoresist, a moldable plastic, a thermoplastic, and a thermoset plastic.

Figure 5:
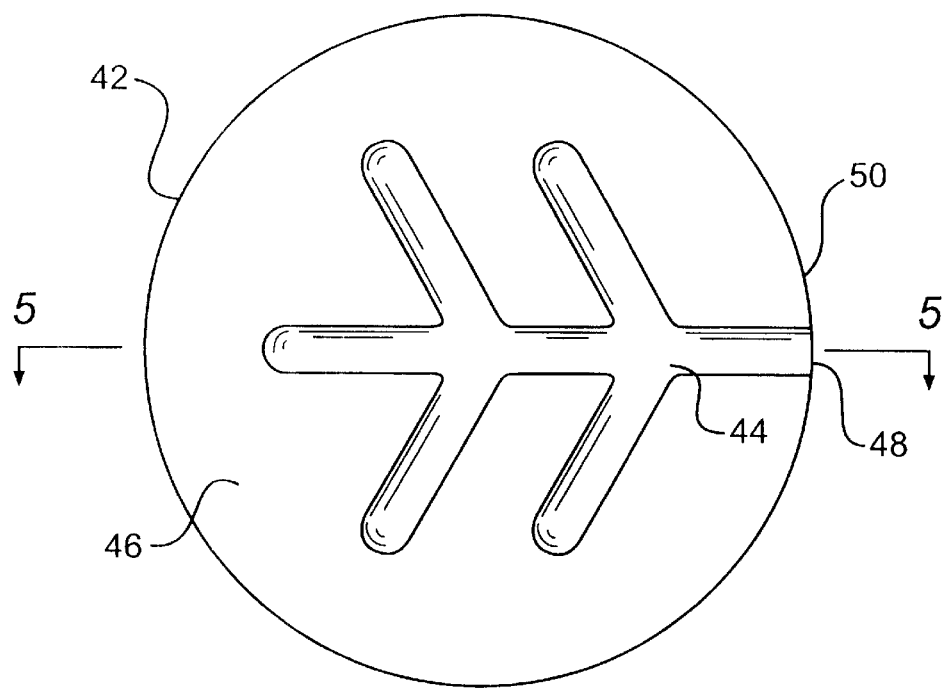
FIG. 5 is a top view of a substrate with a manifold connecting multiple capacitor elements.
Figure 6:
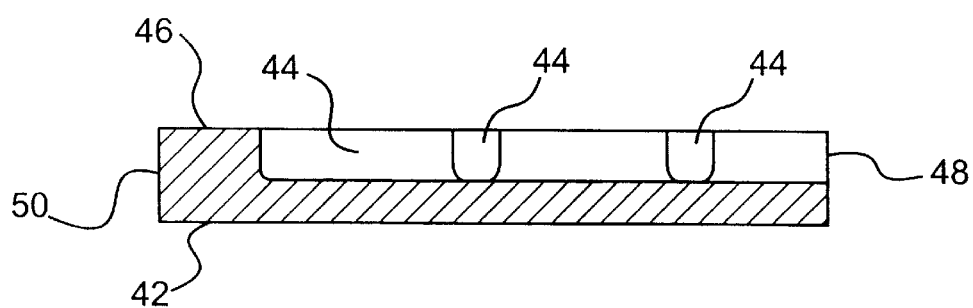
FIG. 6 is a sectional view of the substrate of FIG. 5.

FIG. 5 is a top view, and FIG. 6 is a sectional view, of a support member 42 of conducting material in which a manifold passage 44 is formed in surface 46. As an example, this illustration depicts the layout and orientation of manifold passage 44 selected to connect cavities 22 of capacitive transducer 40 of FIG. 3D. Surface 46 of support member 42 can be bonded to surface 16 of transducer 40 to provide a single port 48 at edgewall 50 for pressure equalization, fluid filling, or for evacuating the internal volume of transducer 40. Support member 50 also provides an electrical connection to rigid electrode 24 via metal layer 28 and electrical connection 26.

Figure 7:
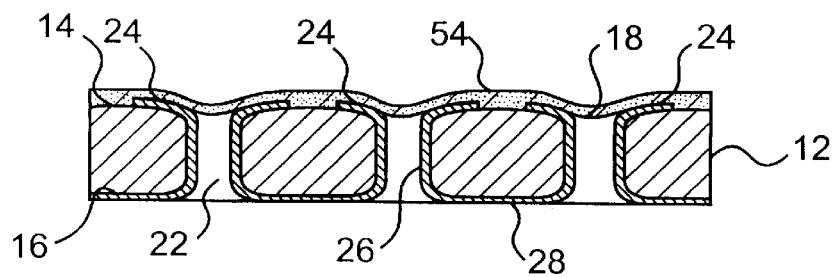
FIG. 7 is a view of the substrate of FIG. 3B with a dielectric layer deposited over a metal layer.

For transducer 10 of FIG. 1 and transducer 40 of FIG. 3D, dielectric layer 32 is provided on diaphragm 30. Variable-area capacitors also can be constructed by providing a dielectric layer on a rigid electrode. FIG. 7 is a sectional view of substrate 12 of FIG. 3B with a dielectric layer 54 deposited on and over the metal layer comprising rigid electrode 24. Insulating layer 54 controls the area of fixed capacitive spacing between the capacitor electrodes when the bonded side of diaphragm 30 is electrically conducting.

A capacitive transducer 10 of FIG. 1 and transducer 40 of FIG. 3D can be constructed by providing substrate 12 of a conducting material. This construction eliminates the steps of depositing metal layers to form rigid electrode 24 and metal film 28.

Figure 8:
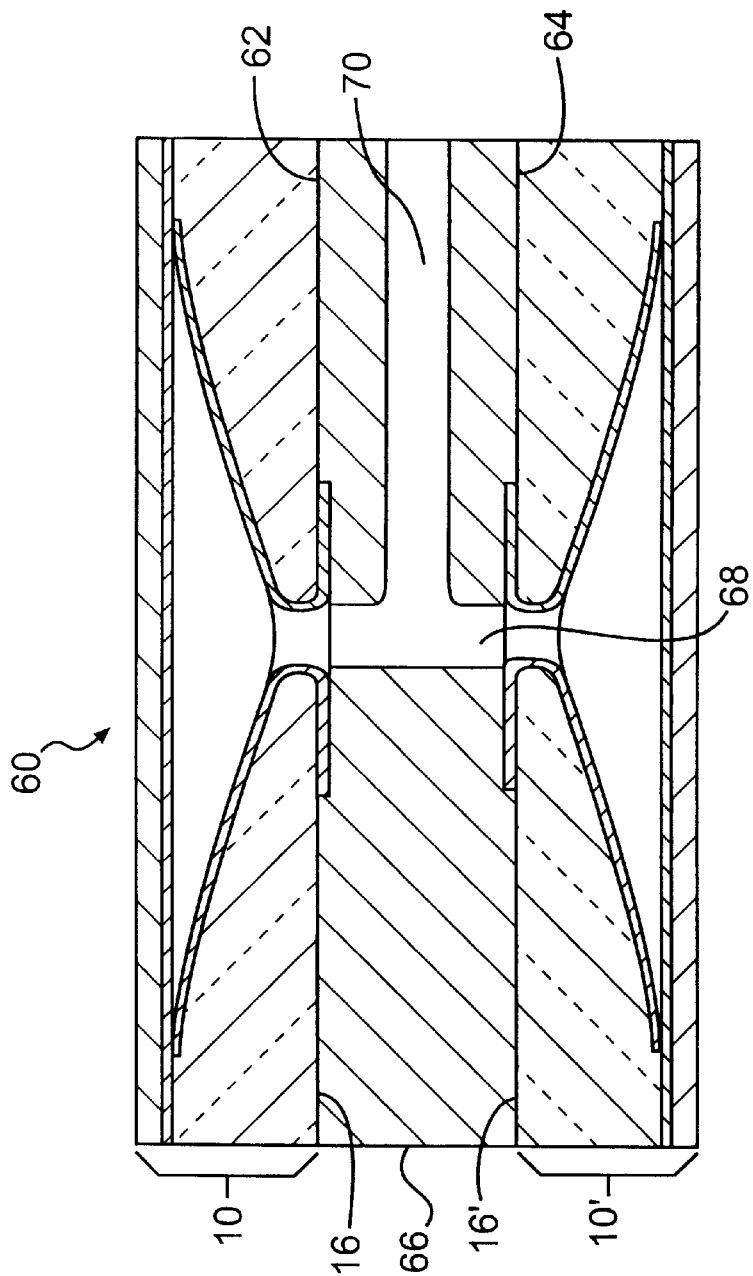
FIG. 8 is a sectional view of a differential capacitive transducer.

FIG. 8 is a sectional view of a differential pressure transducer generally shown by reference numeral 60. Transducer 60 is constructed by affixing surfaces 16 and 16' of two variable-area capacitive transducers 10 and 10' of FIG. 1 to a top surface 62 and a bottom surface 64 of an electrically conducting support body 66 with a interconnecting cavity 68 connected to a internal passage 70 used for pressure equalization or for fluid filling. The construction of capacitive transducer 60 is similar that of differential pressure transducer of Valentin et al, U.S. Pat. No. 4,829,826. The significant difference is the Valentin invention includes two, variable-gap capacitors that do not have the advantages of the variable-area capacitors of U.S. Pat. No. 6,151,967.

FORMING THE CONTOURED REGION FOR A RIGID ELECTRODE

The method selected to form contoured region 18 (with or without connecting cavity 22) of transducer of FIG. 1; transducer 40 of FIG. 3D; and substrate 12 of FIG. 4 is determined in part by: a) the material of substrate 12 or a dielectric layer on substrate 12, b) the overall size and shape of contoured region 18; c) the linearity of the capacitance response of the transducer; and d) the desired quiescent capacitance, maximum full-scale capacitance, and dynamic response of the transducer.

Capacitive transducer 10 of FIG. 1 has been fabricated with 0.002 to 0.5 mm thick silicon diaphragms bonded to borosilicate glass substrates with 12-mm diameter rigid capacitor electrodes. Contoured regions 18 were ductile-mode ground with a template tracing grinding machine using a 100:1 reduction lever arm. The tracing template was fabricated by computer-controlled, electrical discharge machining (EDM). Ductile-mode grinding was achieved by dressing individual SiC abrasive grains bonded in a narrow wheel using a custom diamond tool. The aforementioned grinding machine was also operated as a 100:1 template tracing lathe for single-point diamond machining contoured regions for rigid electrodes in polycarbonate substrates. Smaller contoured regions with features including ridges and valleys have been formed in single crystal silicon substrates by the method disclosed in U.S. Pat. No. 6,151, 967.

Referring to FIGS. 1, 2, 3A, and 4, contoured regions 18 with lateral dimensions generally within the 0.01 to 1.0 mm size range can be formed by the following methods:

1) Etching, polishing, or ablating material from planar surface 14 or from a material layer formed on planar surface 14;
2) Depositing or spinning a partially conformal material layer over wells, cavities, or trenches formed in planar surface 14 or in a material layer formed on planar surface 14;
3) Partially planarizing wells, cavities, or trenches formed in planar surface 14 or in a material layer formed on planar surface 14;
4) Selectively depositing material on a region of planar surface 14;
5) Thermally forming contoured region 18 in substrate 12 of a thermoplastic material.

Dish-shaped depressions and valleys can be formed in a material surface by chemical or photon assisted chemical etching; plasma or RIE plasma etching; ion milling; and polishing or chemical-mechanical polishing. Etching can be performed in one or more steps using a temporary contact masking layer, while ion milling can be performed with the aid of a contact masking layer or directly by a focused ion beam. Contoured regions also can be formed by ablating material from a substrate by a focused beam selected from a group consisting of plasma, ions, electrons, and UV photons.

Polishing also can be used to form dish-shape depressions and valleys. First wells, cavities, or trenches are etched in a material layer and then the features polished to form the desired surface contour. The incurvature at the edge of patterned features can be controlled in part by polishing pressure, slurry type, abrasive material type and particle size, and by the motion, material, and the elastic properties of the polishing lap.

When a contoured region 18 is formed by etching, polishing, or milling of a thin cover layer on a substrate, the incurvation at the edges of stepped features can may be controlled in part by selecting materials for the cover layer and substrate with different material removal rates.

Dish-shaped depressions and valleys can be formed by applying a partially conformal layer, such as spin-on-glass (SOG) or LPCVD deposited borophosphosilicate glass (BPSG), over wells, cavities, or trenches formed in a material surface. This step also can be combined with etching or polishing steps before or after the application of the partially conformal layer.

Contoured regions in a material surface can be formed by other methods used to planarize stepped features in the material layers of integrated circuits and isolation trenches in substrates during the manufacture of semiconductor devices. One method includes forming wells, cavities, or trenches in a material layer applied to substrate 12, such as SOG or BPSG. The desired shape of the contoured region is then formed by the incurvature at the edges of stepped features by thermal meltback by oven or laser heating.

The contoured regions 18 of substrates 12 of a polymer material can be formed by the methods of compression molding, injection molding, casting, thermal forming, embossing, coining, replication, imprint lithography, and stero-photolithograpy methods. Contoured regions in metal substrates can be formed by embossing, coining, and EDM.

Connecting cavity 22 can be formed before, during, or after forming contoured region 18. When cavity 22 is formed before or after forming contoured region 18, it can be formed by conventional drilling, microdrilling, UV laser ablation, ion milling, as well as chemical, plasma, and RIE plasma etching through a temporary contact mask. The method selected is determined in part by the material and material thickness of substrate 12 and by the dimensions of cavity 22.

Referring to FIG. 7, rigid electrode 24 can be formed by depositing an electrically conducting layer over a region of surface 24 of substrate 12 in which stepped features are formed and partially planarized. Alternately, rigid electrode 24 may be formed by depositing an electrically conducting layer over a material layer deposited on surface 14 of substrate 12 in which stepped features are formed and partially planarized.

FABRICATION OF ACCELEROMETERS

Accelerometers have been fabricated by the method of the present invention by the additional step of suspending a central proof-mass to diaphragm 30 of capacitive transducer 10 of FIG. 1. Other accelerometers and seismometers have been fabricated by forming a integral central hub on two-micrometer thick silicon diaphragms during the steps of micromachining the diaphragm.

While the preferred forms and embodiments of the instant invention have been illustrated and described, the preferred embodiments described above are not meant to limit the scope of the appended claims.

What is claimed is:

1. A method to construct a capacitive transducer comprising the steps of: providing a substrate with a planar surface; forming over and in said planar surface at least one rigid electrode of a variable-area capacitor that is electrically connected to a region on said substrate reserved for electrode attachment; and providing and bonding a cooperating flexible electrode with a dielectric layer to said planar surface in a region surrounding said rigid electrode.

2. The method as claimed in claim 1 further including a step of forming a passage in said substrate between at least one said rigid electrode and a surface of said substrate.

3. The method as claimed in claim 1 further including a step of suspending a proof-mass on said flexible electrode.

4. The method as claimed in claim 1 wherein said flexible electrode comprises a metallized film of thermoplastic material.

5. The method as claimed in claim 1 wherein said flexible electrode comprises a conducting layer deposited on doped silicon.

6. The method as claimed in claim 1 wherein said dielectric layer comprises material selected from the group consisting of silicon dioxide, silicon nitride, silicon oxynitride, silicon carbide, aluminum oxide, glass, PMMA, photoresist, and a thermoplastic.

7. The method as claimed in claim 1 wherein a material of said substrate is selected from the group consisting of glass, fused silica, quartz, sapphire, oxidized silicon, PMMA, an epoxy, a photoresist, a moldable plastic, a thermoplastic, and a thermoset plastic.

8. The method as claimed in claim 1 wherein said substrate is silicon and the step of providing said substrate includes the step of forming a dielectric layer on a region of said planar surface.

9. The method as claimed in claim 1 wherein the step of forming said rigid electrode includes the steps of forming a contoured region over and in a region of said planar surface of said substrate and depositing an electrically conducting layer over said contoured region.

10. The method as claimed in claim 9 wherein the step of forming said contoured region includes etching material from a region of said planar surface.

11. The method as claimed in claim 9 wherein the step of forming said contoured region includes polishing material from a region of said planar surface.

12. The method as claimed in claim 9 wherein the step of forming said contoured region includes ablating material from a region of said planar surface by a focused beam selected from a group consisting of plasma, ions, electrons, and UV photons.

13. The method as claimed in claim 9 wherein the step of forming said contoured region includes the steps of forming stepped features in a region of said planar surface and covering said features with a partially conformal material layer.

14. The method as claimed in claim 9 wherein the step of forming said contoured region includes the steps of forming stepped features in a region of said planar surface of said substrate and partially planarizing said features.

15. The method as claimed in claim 9 wherein the step of forming said contoured region includes the steps of depositing a material layer on a region of said planar surface; forming stepped features in said material layer; and partially planarizing said stepped features.

16. A method to construct a capacitive transducer comprising the steps of: providing a substrate with a planar surface; forming over and in said planar surface at least one rigid electrode of a variable-area capacitor; depositing a dielectric layer over said rigid electrode; and providing and bonding a cooperating flexible electrode to said planar surface in a region surrounding said rigid electrode.

17. The method as claimed in claim 16 further including a step of forming a passage in said of said substrate.

18. The method as claimed in claim 16 further including a step of suspending a proof-mass on said flexible electrode.

19. The method as claimed in claim 16 wherein a material of said substrate is selected from the group consisting of glass, fused silica, quartz, sapphire, silicon, PMMA, an epoxy, a photoresist, a moldable plastic, a thermoplastic, and a thermoset plastic.

20. The method as claimed in claim 16 wherein the step of forming said rigid electrode includes the steps of forming a contoured region over and in a region of said planar surface of said substrate and depositing an electrically conducting layer over said contoured region.

* * * * *